United States Patent
Obuchi

(10) Patent No.: US 7,459,747 B2
(45) Date of Patent: Dec. 2, 2008

(54) NONVOLATILE SEMICONDUCTOR MEMORY DEVICE AND MANUFACTURING METHOD OF THE SAME

(75) Inventor: Masahiro Obuchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 186 days.

(21) Appl. No.: 11/363,507

(22) Filed: Feb. 28, 2006

(65) Prior Publication Data
US 2006/0221698 A1 Oct. 5, 2006

(30) Foreign Application Priority Data
Mar. 2, 2005 (JP) .............................. 2005-057111

(51) Int. Cl.
*H01L 27/108* (2006.01)
*H01L 29/94* (2006.01)
(52) U.S. Cl. ..................... 257/312; 257/530; 257/296
(58) Field of Classification Search ................. 257/296, 257/312, 530
See application file for complete search history.

(56) References Cited

U.S. PATENT DOCUMENTS 4,899,205 A * 2/1990 Hamdy et al. ............... 257/530
5,278,784 A * 1/1994 Ishihara et al. .............. 365/96
5,386,135 A * 1/1995 Nakazato et al. ............ 257/369

FOREIGN PATENT DOCUMENTS

| JP | 2003-114247 | 4/2003 |
| JP | 2004-193606 | 7/2004 |
| JP | 2004-356631 | 12/2004 |

* cited by examiner

*Primary Examiner*—Richard Elms
*Assistant Examiner*—Allison P Bernstein
(74) *Attorney, Agent, or Firm*—Morrison & Foerster LLP

(57) ABSTRACT

The invention realizes a smaller-sized OTP memory cell and large reduction of its manufacturing process and cost. An embedded layer (BN+) to be a lower electrode of a capacitor is formed in a drain region of a cell transistor of an OTP memory, a capacitor insulation film having a small thickness where dielectric breakdown can occur by a predetermined voltage applied from a data line is formed on this embedded layer, and a conductive layer to be an upper electrode of a capacitor is formed on the capacitor insulation film and on a field oxide film. The embedded layer (BN+) partially overlaps a high concentration drain region (N+).

7 Claims, 5 Drawing Sheets

Write

Read

NONVOLATILE SEMICONDUCTOR MEMORY DEVICE AND MANUFACTURING METHOD OF THE SAME

CROSS-REFERENCE OF THE INVENTION

This invention is based on Japanese Patent Application No. 2005-057111, the content of which is incorporated by reference in its entirety.

BACKGROUND OF THE INVENTION

1. Field of the Invention

The invention relates to a nonvolatile semiconductor memory device and a manufacturing method thereof, particularly, a one time programmable (OTP) memory and a manufacturing method thereof.

2. Description of the Related Art

An electronic tag for contactless identification of an object has been broadly used in recent years (e.g. physical distribution management, room access control, account management, and so on by a RFID tag). The RFID (Radio Frequency Identification) identifies and manages people or objects by a micro electronic tag, and is receiving much attention as a basic technology for promoting information technology and automation in a society as well as promoting a product identification and management technology replacing a bar code.

The electronic tag is attached to each of a large number of objects to be identified, and stores digital data about the attached object in its built-in memory. Generally, the digital data are contactlessly read and written with a reader/writer on the user side.

A mask ROM is an example of a memory storing digital data. The digital data in this mask ROM is fixedly stored when the mask ROM is completed. Therefore, after an electronic tag set with this mask ROM is marketed as a product, the user of the electronic tag can not write arbitrary digital data in the mask ROM.

Therefore, a nonvolatile memory such as EPROM or EEPROM in which the required digital data can be electrically written on the user side is used as a memory set in the described electronic tag.

However, the conventional electronic tag using EPROM or EEPROM as a memory has large die size and a complex manufacturing process due to the structure of EPROM or EEPROM, thereby increasing a manufacturing cost. This causes a problem of increasing a unit cost of the memory and the electronic tag set with this memory.

Therefore, it is preferable to use a one time programmable memory (referred to as an OTP memory) as a memory for the electronic tag or the like for minimizing the die size and the manufacturing cost. The OTP memory is written with data only once at the first time and then used without deletion of the data or addition of a program, as reflected in its name. Although the OTP memory is not often used as a product by itself since the stored data can not be changed, there are increasing demands for the OTP memory as a device for performing an auxiliary function in a semiconductor device as well as in the electronic tag.

A general OTP memory cell has a layered structure of a floating gate, a dielectric film, and a control gate formed in this order, as disclosed in Japanese Patent Application Publication Nos. 2004-193606 and 2004-356631. The relevant technology is also described in Japanese Patent Application Publication No. 2003-114247.

Usually, a semiconductor device has a few OTP memory cells therein, and the area of the OTP memory cells relative to the total area of a semiconductor product is not large. However, the general OTP memory cell has the layered structure as described above for obtaining nonvolatile characteristics. This layered structure is referred to as a PIP structure as a matter of convenience since a polysilicon layer, an insulation layer, and a polysilicon layer are generally formed in this order therein.

This layered structure (PIP structure) is formed by a complex manufacturing process, and increases a manufacturing cost of an electronic tag or semiconductor product with the OTP memory cell. Furthermore, the OTP memory cell is formed on a semiconductor substrate together with a high voltage cell transistor, which is relatively thick, to form an integrated circuit (since high voltage is applied in a writing operation), thereby increasing the die area.

Therefore, it is necessary to provide an OTP memory cell with high quality and a low cost in order to practically promote the semiconductor product or electronic tag with the OTP memory cell.

SUMMARY OF THE INVENTION

The invention provides a nonvolatile semiconductor memory device that includes a plurality of word lines, a plurality of data lines and a plurality of memory cells formed on a semiconductor substrate. Each of the memory cells includes a transistor and a capacitor. The transistor includes a drain region, a source region and a gate electrode connected with a corresponding word line. The capacitor includes an impurity-implanted lower electrode formed in the drain region, an insulation film disposed on the lower electrode and an upper electrode disposed on the insulation film and connected with a corresponding data line. The memory device also includes a voltage supply circuit applying a voltage to the data lines. The insulation film is configured to break down when a predetermined voltage is applied to the insulation film through a corresponding data line so that a predetermined data is written in the memory device.

The invention also provides a method of manufacturing a nonvolatile semiconductor memory device. The method includes providing a semiconductor substrate, forming a first impurity region in the substrate, forming an insulation film on the first impurity region, forming a second impurity region in the first impurity region, forming a conductive layer on the insulation film so that the second impurity region, the insulation film and the conductive layer form a capacitor, and forming a transistor having the first impurity region as a drain region so that the transistor and the capacitor form a memory cell.

DETAILED DESCRIPTION OF THE INVENTION

An embodiment of the invention will be described with reference to figures. An OTP memory of the embodiment is set in an electronic tag, for example, but it is possible to use the memory set in the other semiconductor product or by itself.

Figure 1:
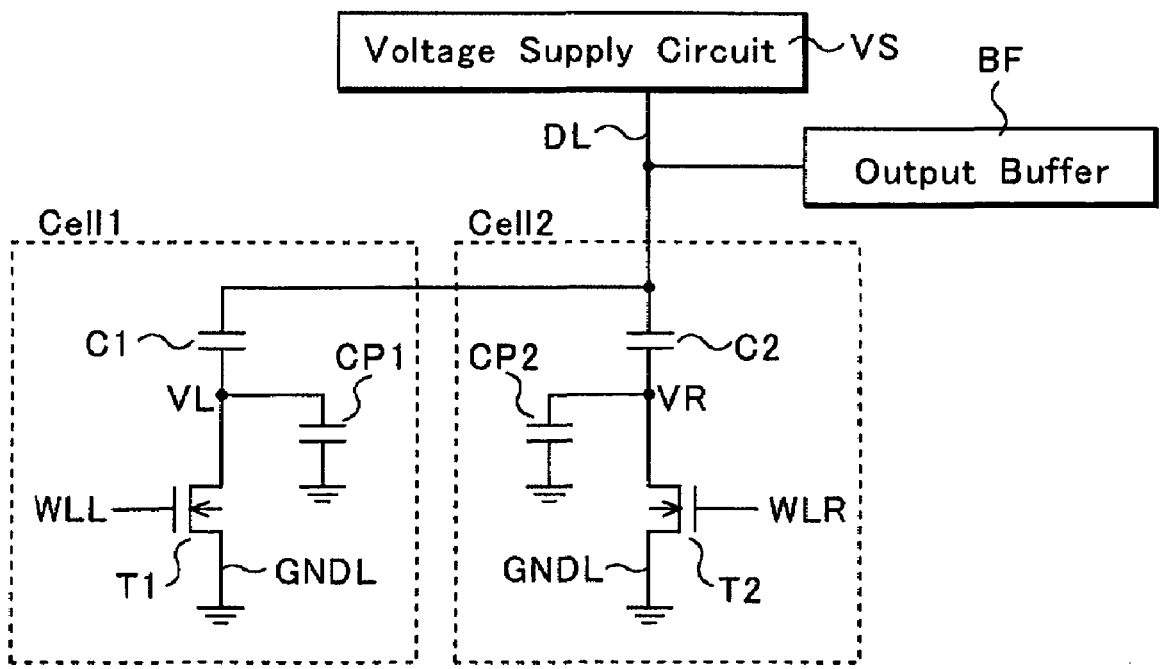
FIG. 1 is a circuit diagram for explaining a nonvolatile semiconductor device of the invention.
Figure 2A:
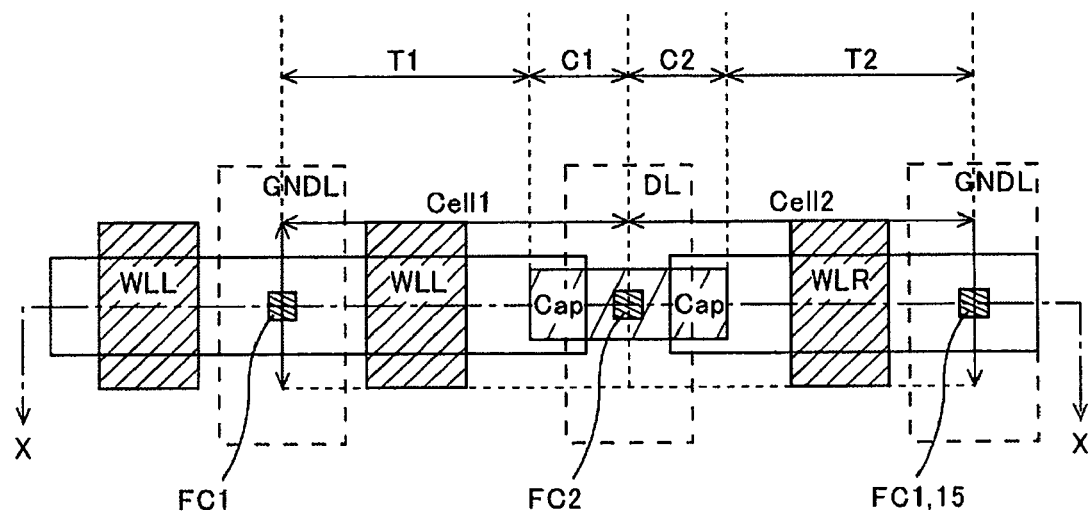
FIGS. 2A and 2B are a layout view and a cross-sectional view for explaining the nonvolatile semiconductor device of the invention.

FIG. 1 is a circuit diagram of the OTP memory of the embodiment of the invention, and FIG. 2A is a layout view of the OTP memory of the embodiment shown in FIG. 1.

A pair of a cell transistor T1 and a capacitor C1 and a pair of a cell transistor T2 and a capacitor C2 respectively form one cell (Cell1, Cell2) of the OTP memory of the embodiment, as shown in FIG. 1 and FIG. 2A. The Cell1 and Cell2 are symmetrical to each other with respect to a second contact hole FC2 as a center, as shown in FIG. 2A.

Word lines WLL and WLR (e.g. made of a polysilicon layer or a polycide layer) are disposed being electrically connected to gate electrodes of the cell transistors T1 and T2, respectively. Drain regions of the cell transistors T1 and T2 are connected to lower electrodes of the capacitors C1 and C2, and those voltages are VL and VR, respectively.

Parasitic capacitors CP1 and CP2 exist in the drain regions of the cell transistors T1 and T2 (the lower electrodes of the capacitors C1 and C2). The parasitic capacitors CP1 and CP2 are mainly PN junction capacitors.

Furthermore, source regions of the cell transistors T1 and T2 are grounded through grounding conductors GNDL, and upper electrodes of the capacitors C1 and C2 are electrically connected to a data line DL. The data line DL is connected to a voltage supply circuit VS, and a voltage is supplied from the voltage supply circuit VS to the data line DL. When data is read out, a voltage is outputted to the outside through an output buffer BF.

Figure 2B:
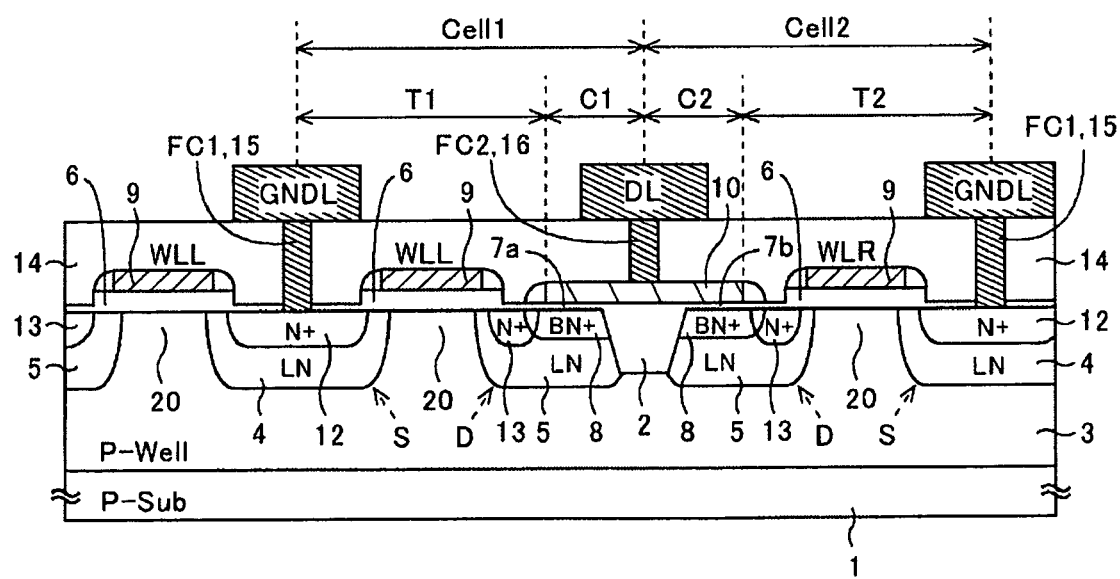

Next, the OTP memory of the embodiment will be described in detail with reference to its cross-sectional view. FIG. 2B is a cross-sectional view of the OTP memory of the embodiment shown in FIG. 2A along line X-X.

As shown in FIG. 2B, a source region S formed of a high concentration source region 12 (N+) and a low concentration source region 4 (LN) and a drain region D formed of a high concentration drain region 13 (N+) and a low concentration drain region 5 (LN) are formed on a surface of a semiconductor substrate 1 made of, for example, a P-type silicon substrate at a predetermined interval, and a channel region 20 is formed between these regions.

The high concentration source region 12 (N+) is formed in the low concentration source region 4 (LN), and the high concentration drain region 13 (N+) is formed in the low concentration drain region 5 (LN). That is, the cell transistors T1 and T2 of the embodiment have a so-called LDD (Lightly Doped Drain) structure, and the other cell transistors also have the same LDD structure. This is for securing a withstand voltage against a high voltage applied when data is written, but the invention is not limited to this and does not necessarily have the LDD structure according to needs.

A gate electrode 9 made of polysilicon or the like is formed on a part of the channel region 20 and on a part of the source region S and the drain region D with a high withstand voltage gate insulation film 6 having a large thickness (e.g. thickness 60 nm) therebetween. The gate electrode 9 is electrically connected to the word lines WLL and WLR through a wiring (not shown).

An embedded layer 8 (BN+) as a high concentration impurity layer (BN+) is formed in the drain region D. This embedded layer 8 (BN+) is a lower electrode of the capacitors C1 and C2, and partially overlaps the high concentration drain region 13 (N+) in this embodiment.

The entire die area can be reduced by such partial overlapping of the high concentration drain region 13 (N+) in the drain region D and the embedded layer 8 (BN+) to be the lower electrode of the capacitor. However, the invention is not limited to this, and the high concentration drain region 13 (N+) and the embedded layer 8 (BN+) do not necessarily overlap each other according to needs.

The impurity concentrations of the low concentration drain region 5 (LN), the high concentration drain region 13 (N+), and the embedded layer 8 (BN+) are preferably LN<BN+<N+, for securing a withstand voltage. This is because the impurity concentration of the entire drain region D increases and its withstand voltage reduces when the impurity concentration of the embedded layer 8 (BN+) is higher than that of the high concentration drain region 13 (N+).

A field oxide film 2 for isolating an active region (OTP memory cell) is formed on the semiconductor substrate 1. It is preferable that the field oxide film 2 has a so-called STI structure (shallow trench isolation) for reducing the cell size, but it can have a LOCOS structure. The drain region D and the embedded layer 8 (BN+) are formed adjacent to this field oxide film 2 in order to reduce the cell size.

Capacitor insulation films 7a and 7b made of a silicon oxide film or the like are formed on a part of the drain regions D from on the embedded layers 8 (BN+) onto the field oxide film 2, and a conductive layer 10 made of a polysilicon layer or the like is formed with these capacitor insulation films 7a and 7b therebetween. The conductive layer 10 is to be an upper electrode of the capacitor.

In this embodiment, the thickness of the capacitor insulation films 7a and 7b is, for example, 6 nm and smaller than that of the gate insulation film 6. Because the data writing is performed by dielectric breakdown of the capacitor insulation films 7a and 7b, a thinner thickness of the insulation films 7a and 7b results in a lower voltage for the writing operation. With this structure, a withstand voltage is secured in the cell transistors T1 and T2, while dielectric breakdown is easy to occur in the capacitor insulation films 7a and 7b in the capacitors C1 and C2.

An interlayer insulation film 14 is formed on these cell transistors T1 and T2 and on the capacitors C1 and C2. The interlayer insulation film 14 is made of, for example, a silicon oxide film, but can be made of a composite film including a silicon nitride film or the like. Contact holes FC1 and FC2 are formed in this interlayer insulation film 14.

The contact holes FC1 are formed to expose the source regions S of the cell transistors T1 and T2. Plugs 15 made of a conductive material such as aluminum (Al) or tungsten (W) are embedded in these contact holes FC1. The grounding conductors GNDL are formed on the plugs 15, and electrically connected to the source regions S of the cell transistors T1 and T2 through the plugs 15.

Another contact hole FC2 is formed to expose the conductive layer 10 as the upper electrode of the capacitors C1 and C2. A plug 16 is embedded in this contact hole FC2, too, like in the contact hole FC1. The data line DL is formed on the plug 16, and the data line DL is electrically connected to the conductive layer 10 through the plug 16.

This conductive layer 10 can be electrically connected to the drain regions D of the cell transistor T1 and T2 through the embedded layers 8 (BN+) by dielectric breakdown of the capacitor insulation films 7a and 7b. That is, the drain regions D become connected to the data line DL through the plug 16, the conductive layer 10, the embedded layers 8 (BN+) by dielectric breakdown of the capacitor insulation films 7a and 7b.

Figure 3A:
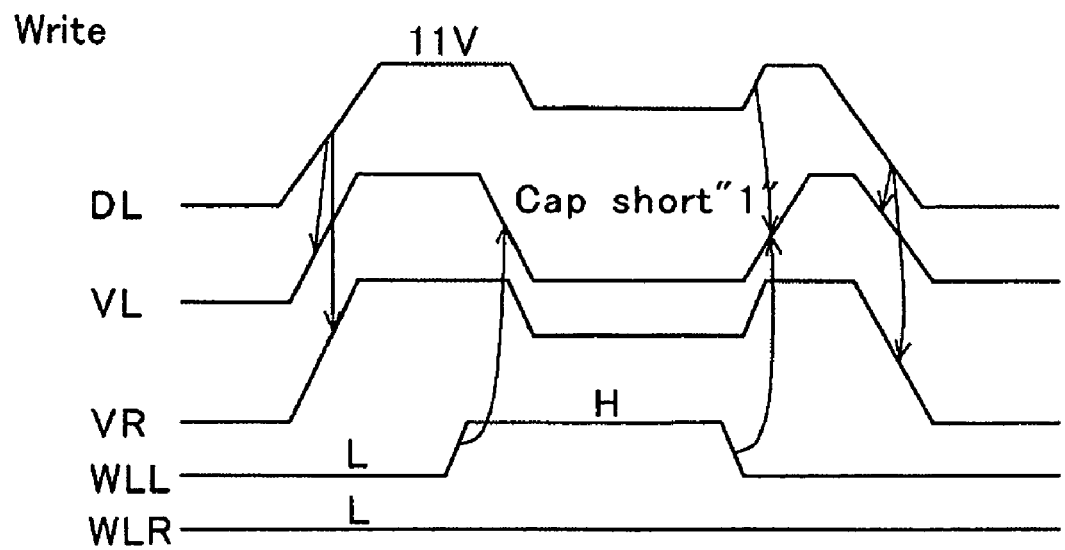
FIGS. 3A and 3B are charts for explaining an operation of the nonvolatile semiconductor device of the invention.
Figure 3B:
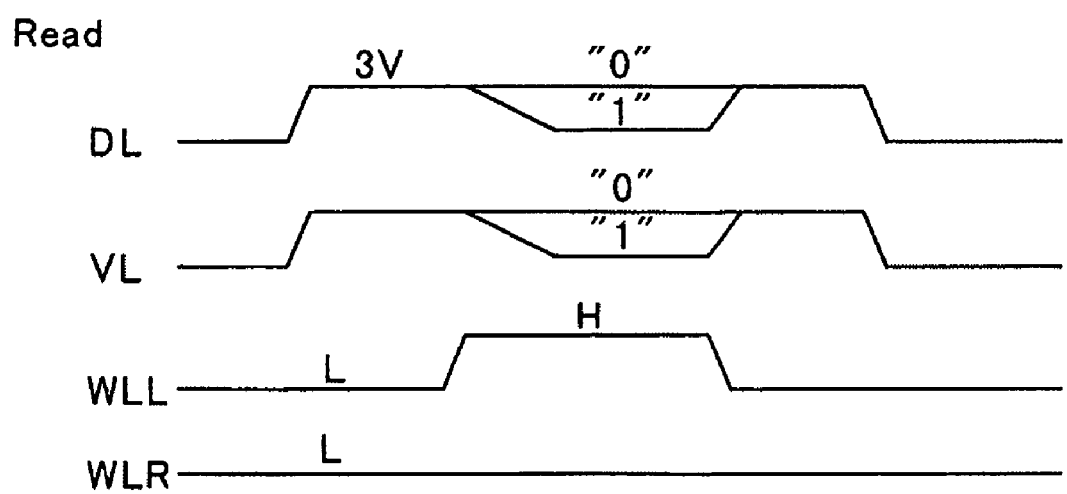

Next, a writing operation for storing digital data "1" or "0" in the described OTP memory will be described with reference to FIGS. 3A and 3B. FIG. 3A shows potential variation of each of the data lines DL, VL, and VR, the word line WLL, and the word line WLR in the data writing operation. FIG. 3B shows potential variation of each of the data lines DL and VL, the word line WLL, and the word line WLR in a data reading operation.

First, a case of writing the digital data "1" in the cell transistor T1 will be described. In this case, the potential of the word line WLL connected to the cell transistor T1 is changed from a low level (L) to a predetermined high level (H). Then, the cell transistor T1 turns on.

Then, a predetermined writing voltage (e.g. 11V) is applied to the data line DL connected to the conductive layer 10. The predetermined writing voltage is a high enough voltage to cause dielectric breakdown to the capacitor insulation films 7a and 7b of the capacitors C1 and C2 connected to the data line DL.

At this time, since the cell transistor T1 is in the on state by the high level potential (H) of the word line WLL, the potential of the drain region D of the cell transistor T1 becomes the ground potential. Therefore, the predetermined writing voltage applied to the data line DL is all applied to the capacitor existing between the data line DL and the drain region D, that is, the capacitor insulation film 7a.

This causes dielectric breakdown to the capacitor insulation film 7a (Cap Short), and the drain region D of the cell transistor T1 and the corresponding data line DL becomes electrically connected to each other. Hereafter, the cell transistor T1 of which the drain region D is connected to the data line DL by the dielectric breakdown is referred to as a cell transistor in a memory state "1".

On the other hand, since the cell transistor T2 is also connected to the data line DL, data writing is also performed to the cell transistor T2 by the same operation as above if the cell transistor T2 is in the on state. However, if the potential of the word line WLR connected to the cell transistor T2 is in a low level (L), that is, the cell transistor T2 is in an off state, dielectric breakdown does not occur in the capacitor insulation film 7b and digital data "1" is not written in the cell transistor T2.

At this time, in the cell transistor T2 in the off state, a junction capacitor (an electrostatic capacitor formed by a depletion layer of a PN junction) exists in a boundary of a P-well region 3 of the p-type semiconductor substrate 1 in the ground potential and the low concentration drain region 5 (LN). Therefore, the writing voltage applied to the data line DL is split into two to be applied to the capacitor of the capacitor insulation film 7b and the junction capacitor.

At this time, the electrostatic capacitor of the capacitor C2 (e.g. 10 fF) is larger than that of the parasitic capacitor CP2 (e.g. lower than 1 fF). Therefore, even if the potential of the data line DL increases, dielectric breakdown does not occur in the capacitor insulation film 7b of the cell transistor T2 since the potential of VR increases as shown in FIG. 3A.

Therefore, for example, even if the cell transistor T1 is in the on state and the enough voltage to cause dielectric breakdown to the capacitor insulation film 7a (e.g. 11V) is applied from the data line DL, dielectric breakdown does not occur in the capacitor insulation film 7b if the cell transistor T2 is in the off state.

Next, a case of writing digital data "0" in the cell transistors T1 and T2 will be described. In this embodiment, a particular writing operation is not needed when the digital data "0" is to be written. For example, when the memory state of the cell transistor T1 is required to be set at "0", a voltage that is enough to cause dielectric breakdown to the capacitor insulation films 7a is not to be applied to the corresponding data line DL. For example, if the writing voltage is 11V, a voltage higher than 11V is not to be applied.

Alternatively, it is possible to set the word lines WLL and WLR at low level and turn the cell transistors T1 and T2 in the off state. This is because that the potential of the drain region D does not become the ground potential (GND) when in the off state, and the predetermined voltage applied to the data line DL is not applied to the capacitor insulation films 7a and 7b. Hereafter, the cell transistor of which the drain region D is insulated from the data line DL without breakdown of the capacitor insulation film 7a or 7b is referred to as a cell transistor in a memory state "0".

Next, an operation of reading digital data "1" or "0" from the described OTP memory cell will be described with reference to FIG. 3B. First, an operation of reading digital data from the cell transistor T1 in the memory state "1" will be described. In this case, the potential of the word line WLL electrically connected to the gate electrode 9 of the cell transistor T1 is changed from the low level (L) to the high level (H).

At this time, the data line DL is previously initialized to a predetermined pre-charged potential (e.g. power supply potential Vdd=3V). When the potential of the word line WLL is changed to the high level (H), the cell transistor T1 turns on. Since the dielectric breakdown occurs in the capacitor insulation film 7a in the state where "1" is written as described above, the drain region D of the cell transistor T1 and the corresponding data line DL are electrically connected to each other.

This makes the ground potential (GND) of the grounding conductor GNDL outputted to the data line DL through the cell transistor T1. Therefore, as shown in FIG. 3B, the potential of the data line DL changes from the pre-charged potential (e.g. Vdd=3V) to the ground potential (GND). At this time, the ground potential of the data line DL is outputted from the data line DL to the outside of the OTP memory through the output buffer BF as digital data "1".

Next, an operation of reading digital data from the cell transistor T1 in the memory state "0" will be described with reference to FIG. 3B. In this case, the potential of the word line WLL connected to the cell transistor T1 is changed from the low level (L) to the high level (H). The data line DL is previously initialized to a predetermined pre-charged potential (e.g. power supply potential Vdd=3V).

When the potential of the word line WLL is changed to the high level (H), the cell transistor T1 turns on. Dielectric breakdown does not occur in the capacitor insulation film 7a in the state where "0" is written as described above, the drain region D of the cell transistor T1 and the corresponding data line DL are not electrically connected to each other.

Then, the potential of the data line DL remains at the pre-charged potential (e.g. Vdd=3V) as shown in FIG. 3B. At this time, the pre-charged potential of the data line DL is outputted from the data line DL to the outside of the OTP memory through the output buffer BF as digital data "0".

In the invention, as described above, the digital data of either "1" or "0" can be written in the OTP memory cell and read therefrom according to dielectric breakdown or no dielectric breakdown of the capacitor insulation films 7a and 7b by applying or not applying a predetermined writing voltage (high voltage, e.g. 11V) from the corresponding data line DL. Furthermore, the digital data can be arbitrarily written on the user side after the OTP memory cell or a product set with the OTP memory cell is completed and marketed.

Next, a manufacturing method of the OTP memory cell of the embodiment of the invention will be described with reference to figures.

Figure 4A:
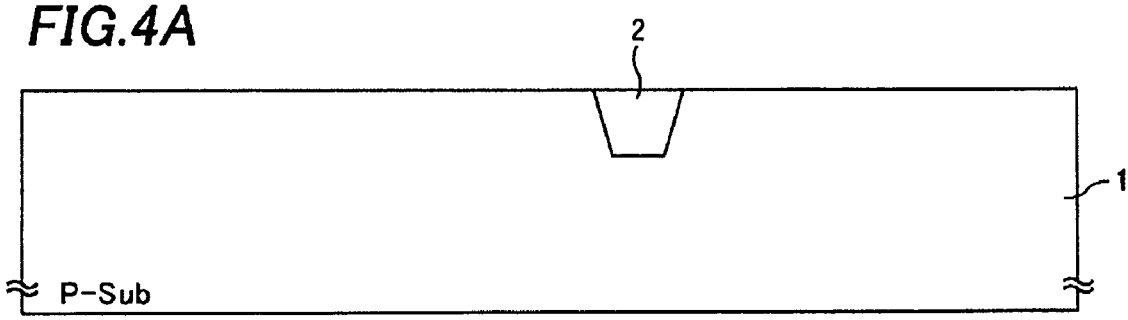
FIGS. 4A, 4B, 4C, and 4D are cross-sectional views for explaining a method of manufacturing the nonvolatile semiconductor device of the invention.

As shown in FIG. 4A, the P-type semiconductor substrate 1 is prepared, and the field oxide film 2 made of a silicon oxide film or the like is formed on the P-type semiconductor substrate 1 by a well-known shallow trench isolation method (hereafter, refereed to as a STI method). The STI method is used for isolating elements of an active region by filling a shallow trench in the semiconductor substrate with an insulation material of a silicon oxide film or the like by high density plasma chemical vapor deposition (HDPCVD), to form the field oxide film 2. A method of local oxidation of silicon (LOCOS) can be also used for the isolation of the elements of the active region.

Figure 4B:
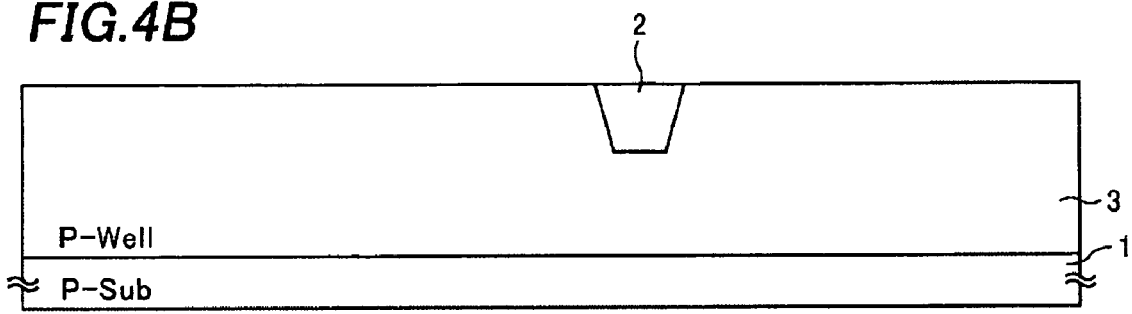

Next, a P-type impurity, for example, boron (B+) is ion-implanted and diffused on the entire surface of the P-type semiconductor substrate 1 under an implantation condition of an acceleration voltage 80 KeV and a dose $4\times10^{12}/cm^2$ to form a P-well region 3, as shown in FIG. 4B.

Figure 4C:
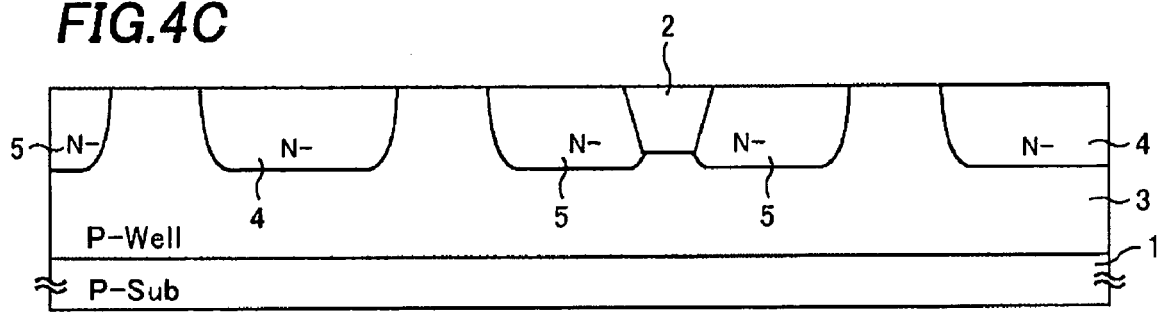

Next, a photoresist layer (not shown) is selectively formed on the P-type semiconductor substrate 1 except in a region that is to be the source region S and the drain region D of the cell transistor by an exposure and development treatment, and an N-type impurity, for example, phosphorus (P+) is ion-implanted and diffused under an implantation condition of an acceleration voltage 80 KeV and a dose $6\times10^2/cm^2$ using this photoresist layer as a mask to form the low concentration source region 4 (LN) and the low concentration drain region 5 (LN), as shown in FIG. 4C.

Figure 4D:
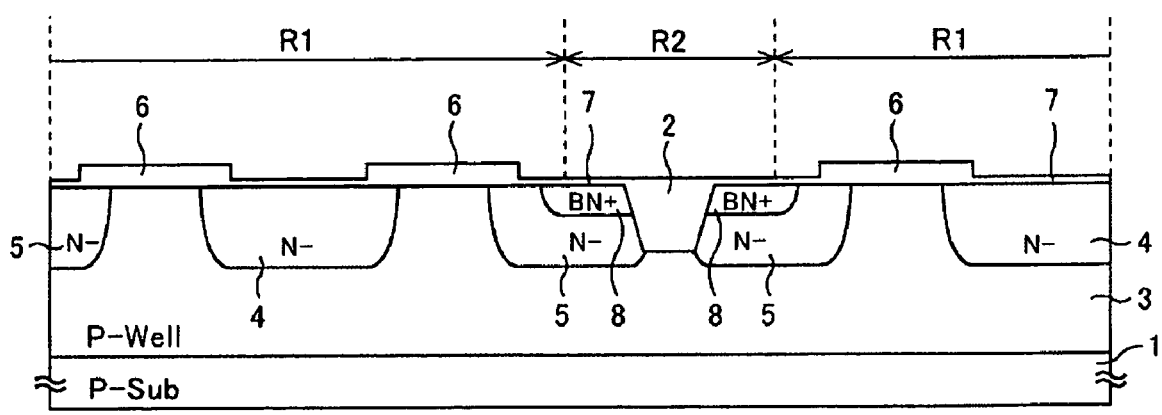

Next, after the photoresist layer is removed, as shown in FIG. 4D, a silicon oxide film 6 (e.g. a thermal oxide film or a TEOS film by a CVD method) having a thickness of, for example, 60 nm is formed so as to cover the surface of the P-type semiconductor substrate 1. The silicon oxide film 6 formed in a gate electrode formation region in a cell transistor formation region R1 is to be the gate insulation film 6.

Next, a photoresist layer (not shown) is selectively formed on the silicon oxide film 6 in the gate electrode formation region of the cell transistor by an exposure and development treatment, and the silicon oxide film 6 is selectively removed by etching using this photoresist layer as a mask.

Next, after the photoresist layer is removed, the P-type semiconductor substrate 1 is thermally oxidized to form a silicon oxide film 7 thinner than the silicon oxide film 6, for example, with a thickness of 6 nm. The silicon oxide film 7 formed in the capacitor formation region R2 is to be the capacitor insulation films 7a and 7b.

Next, as shown in FIG. 4D, an N-type impurity, for example, arsenic (As+) is ion-implanted and diffused under an implantation condition of an acceleration voltage 140 KeV and a dose $5\times10^{14}/cm^2$ using a photoresist layer (not shown) having an opening on a part of the low concentration drain region 5 in the capacitor formation region R2 as a mask, to form the high concentration embedded layer 8 (BN+). This is to be the lower electrode of the capacitor. It is noted that the embedded layer 8 (BN+) is formed adjacent to the field oxide film 2 for size reduction of the cell.

Figure 5A:
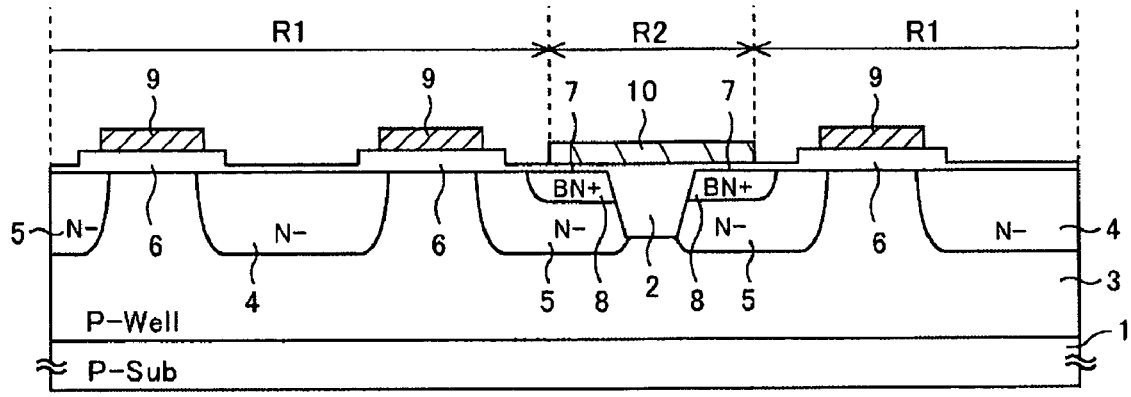
FIGS. 5A, 5B, and 5C are cross-sectional views for explaining the method of manufacturing the nonvolatile semiconductor device of the invention.

Next, a polysilicon film is formed on the entire surface of the P-type semiconductor substrate 1, for example. Then, the gate electrode 9 and the conductive layer 10 to be the upper electrode of the capacitor are respectively formed on the gate insulation film 6 of the cell transistor and on the capacitor insulation films 7a and 7b, using a photoresist layer (not shown) selectively formed on this polysilicon film as a mask, as shown in FIG. 5A.

Figure 5B:
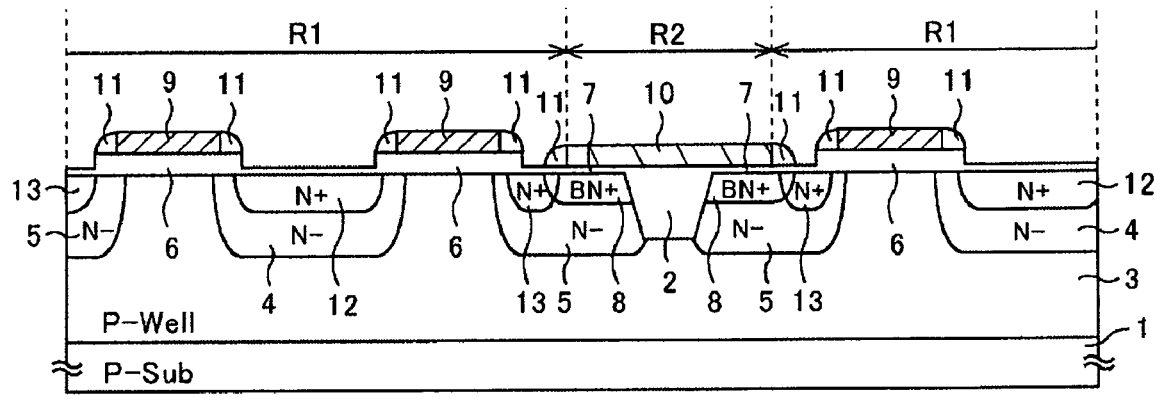

Next, a spacer film 11 is formed on the sidewalls of the gate electrode 9 and the conductive layer 10, as shown in FIG. 5B. This spacer film 11 can be formed by depositing a silicon oxide film by the CVD method and etching back the silicon oxide film. It is possible that the spacer film 11 is made of a silicon nitride film.

Then, an N-type impurity, for example, arsenic (As+) is ion-implanted and diffused under an implantation condition of an acceleration voltage 100 KeV and a dose $5\times10^{15}/cm^2$ using the spacer film 11 as a mask to form the high concentration source region 12 (N+) and the high concentration drain region 13 (N+) in the low concentration source region 4 (LN) and the low concentration drain region 5 (LN), respectively, as shown in FIG. 5B.

It is preferable that the ion-implantation is performed so that the high concentration drain region 13 (N+) partially overlaps the embedded layer 8 (BN+) for the size reduction of the memory cell. Furthermore, as described above, it is preferable that the embedded layer 8 (BN+) is formed so that its impurity concentration is not higher than that of the high concentration drain region 13 (N+), for securing the withstand voltage.

Figure 5C:
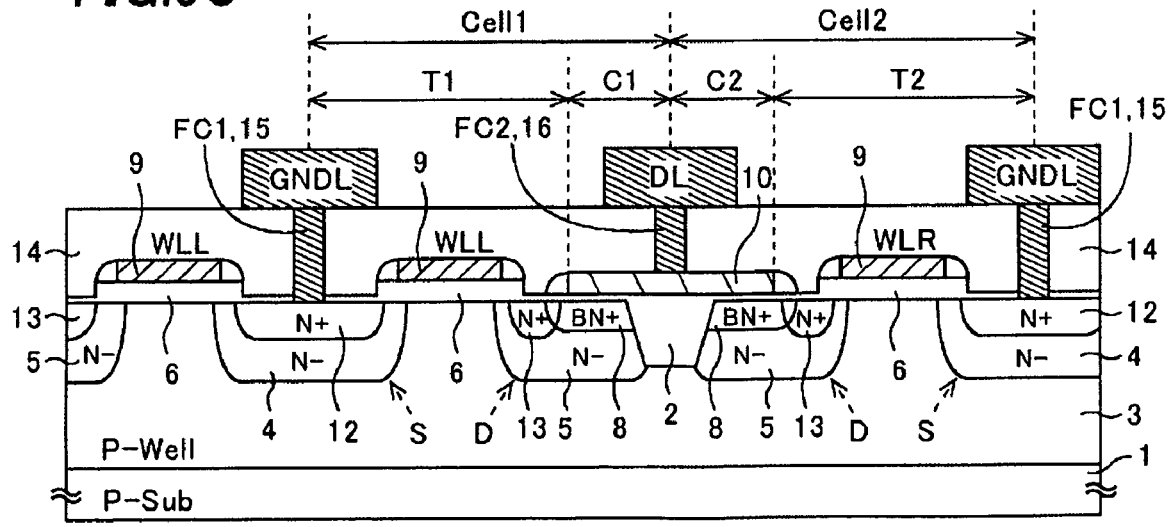

Next, the interlayer insulation film 14 made of, for example, a silicon oxide film or a silicon nitride film is formed by the CVD method, as shown in FIG. 5C. Then, a photoresist layer (not shown) is selectively formed by an exposure and development treatment, the first and second contact holes FC1 and FC2 respectively exposing the high concentration source region 12 (N+) of the cell transistor and the conductive layer 10 are formed using this photoresist layer as a mask, and the contact holes FC1 and FC2 are filled with a conductive material such as aluminum (Al) or tungsten (W) to form the plugs 15 and 16.

Next, although not shown, for protecting the device from external influence, a protection film made of an oxide film or a nitride film is formed and then a contact for electrically connecting to an external wiring is formed. Then, the source region S of the cell transistor is grounded through the first contact hole FC1 and further the grounding conductor GNDL, the gate electrode 9 of the cell transistor is electrically connected to each of the word lines WLL and WLR, and the conductive layer 10 of the capacitor is electrically connected to the data line DL through the second contact hole FC2.

In the nonvolatile semiconductor memory device and its manufacturing method of the embodiment as described above, compared with the conventional OTP memory cell, the size reduction and the large reduction of its manufacturing process and cost are realized, and the manufacturing cost of an electronic tag with the OTP memory cell of the invention or the other semiconductor product set with this memory can be reduced. An OTP memory cell reduced in its cell area from about 36 um$^2$ to 30 um$^2$ (about 15% shrink) is possible according to this embodiment.

Furthermore, the N-type impurity is ion-implanted in the P-well region to form each of the source regions, the drain regions, and the embedded layers in this embodiment. However, it is possible to form each of the source regions, the drain regions, and the embedded layers by ion-implanting a P-type impurity in the N-type semiconductor layer.

In this embodiment, the embedded layer to be the lower electrode of the capacitor is formed in the drain region of the cell transistor of the OTP memory, the capacitor insulation film where dielectric breakdown can occur by a predetermined voltage applied from the data line is formed on this embedded layer, and the conductive layer to be the upper electrode of the capacitor is formed on this capacitor insulation film. This structure can form the OTP memory cell, replacing the conventional layering structure (PIP structure).

This can realize the smaller-sized OTP memory cell and large reduction of its manufacturing process and cost, thereby reducing the manufacturing cost of the electronic tag with the OTP memory cell of the invention or the other semiconductor product set with the OTP memory. The drain region with the second impurity concentration of the cell transistor and the embedded layer to be the lower electrode of the capacitor partially overlap each other, thereby reducing the total die area. The impurity concentration of the embedded layer is higher than the first impurity concentration (low concentration) and lower than the second impurity concentration (high concentration), so that the withstand voltage of the entire drain region can be secured. The thickness of the capacitor insulation film is smaller than the thickness of the gate insulation film of the cell transistor, so that the withstand voltage is secured in the cell transistor while dielectric breakdown is easy to occur in the capacitor insulation film in the capacitor, thereby reducing a writing operation voltage. The embedded layer to be the lower electrode of the capacitor is formed adjacent to the element isolation film, and the conductive layer to be the upper electrode of the capacitor is formed on the element isolation film, thereby realizing the smaller-sized OTP memory cell.

What is claimed is:

1. A nonvolatile semiconductor memory device comprising:
a plurality of word lines;
a plurality of data lines;
a plurality of memory cells formed on a semiconductor substrate, each of the memory cells comprising a drain region, a transistor and a capacitor, the drain region comprising a first drain region arranged between the transistor and the capacitor, the transistor comprising a impurity-implanted second drain region formed in the drain region, a source region and a gate electrode connected with a corresponding word line, the capacitor comprising an impurity-implanted lower electrode formed in the drain region overlapping or adjacent to the second drain region, an insulation film disposed on the lower electrode and an upper electrode disposed on the insulation film and connected with a corresponding data line, wherein the second drain region and the lower electrode are both formed over the first drain region and both have a higher impurity concentration than the first drain region; and
a voltage supply circuit applying a voltage to the data lines, wherein the insulation film is configured to break down when a predetermined voltage is applied to the insulation film through a corresponding data line so that a predetermined data is written in the memory device.

2. The nonvolatile semiconductor memory device of claim 1, wherein an impurity concentration of the lower electrode is lower than an impurity concentration of the second drain region.

3. The nonvolatile semiconductor memory device of claim 1, wherein a thickness of the insulation film is smaller than a thickness of a gate insulation film of the transistor.

4. The nonvolatile semiconductor memory device of claim 1, wherein the lower electrode merges partially with the second drain region.

5. The nonvolatile semiconductor memory device of claim 1, further comprising an element isolation film separating the memory cells, wherein the upper electrode is disposed on the element isolation film.

6. The nonvolatile semiconductor memory device of claim 5, wherein the lower electrode is in contact with the element isolation film.

7. The nonvolatile semiconductor memory device of claim 1, wherein the source region is grounded.

* * * * *